United States Patent
Gundel et al.

(10) Patent No.: US 11,251,822 B1
(45) Date of Patent: Feb. 15, 2022

(54) SOFTWARE DEFINED RADIO (SDR) FILTER RELAXATION TECHNIQUE FOR MULTIPLE-INPUT AND MULTIPLE-OUTPUT (MIMO) AND LARGE ANTENNA ARRAY (LAA) APPLICATIONS

(71) Applicant: XILINX, INC., San Jose, CA (US)

(72) Inventors: Albrecht Gundel, Dresden (DE); Heiko Kaluzni, Grossenhain (DE); Jan Kuhne, Dresden (DE); Noemi Arnez Garcia, Pirna (DE)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/937,527

(22) Filed: Jul. 23, 2020

(51) Int. Cl.
| | | |
|---|---|---|
| *H04B 1/20* | (2006.01) | |
| *H01Q 21/28* | (2006.01) | |
| *H04B 1/30* | (2006.01) | |
| *H04B 1/28* | (2006.01) | |
| *H03D 7/16* | (2006.01) | |
| *H01Q 1/24* | (2006.01) | |

(52) U.S. Cl.
CPC .............. *H04B 1/30* (2013.01); *H01Q 1/243* (2013.01); *H01Q 21/28* (2013.01); *H03D 7/165* (2013.01); *H04B 1/28* (2013.01)

(58) Field of Classification Search
CPC . H04B 1/30; H04B 1/28; H01Q 1/243; H01Q 21/28; H03D 7/165
USPC .............................................. 455/77–86, 126
See application file for complete search history.

(56) References Cited

U.S. PATENT DOCUMENTS

| | | | | |
|---|---|---|---|---|
| 5,410,742 A | * | 4/1995 | Yajima | .................. H03B 5/326 455/316 |
| 6,970,496 B1 | | 11/2005 | Ben-Bassat et al. | |
| 7,469,128 B2 | * | 12/2008 | Pastemak | .............. H01Q 1/125 455/85 |
| 7,804,369 B2 | * | 9/2010 | Saunders | ............. G01S 7/4008 331/25 |
| 2003/0185164 A1 | * | 10/2003 | Marko | ............... H04B 7/18563 370/316 |
| 2010/0309386 A1 | | 12/2010 | Pang et al. | |

OTHER PUBLICATIONS

Qorvo Filter QPQ1287 Data Sheet. Retrieved from https://www.qorvo.com, Jun. 21, 2017, 9 pages.
Qorvo Filter TQQ1030 Data Sheet Rev J. Retrieved from https://www.qorvo.com, 11 pages.

* cited by examiner

*Primary Examiner* — Lee Nguyen
(74) *Attorney, Agent, or Firm* — Patterson + Sheridan, LLP (57) ABSTRACT

An example method of operating a radio system includes receiving, over a receiver-path, an RF input signal from an antenna, and converting the RF input signal to fall within a pre-defined frequency range using a local oscillation signal. The method further includes processing the converted input signal with a standard filter. In some examples, the method further includes generating the local oscillation signal in a transmitter path of the radio system.

20 Claims, 6 Drawing Sheets

Key: Dashed boxes are drawn around additional added components

FIG. 5

SOFTWARE DEFINED RADIO (SDR) FILTER RELAXATION TECHNIQUE FOR MULTIPLE-INPUT AND MULTIPLE-OUTPUT (MIMO) AND LARGE ANTENNA ARRAY (LAA) APPLICATIONS

TECHNICAL FIELD

Examples of the present disclosure generally relate to radio-frequency (RF) reception and, in particular, to filter relaxation techniques for MIMO and LAA applications.

BACKGROUND

Current SDR systems require steep antenna RF-filters in order to comply with international radio specifications. The filters suppress out-of-band emissions during transmission (TX), and reject outside interference during reception (RX). Such filter components are, depending on the application, custom designed, expensive and low volume parts that are specialized for a given use-case. As a result, more commonly available higher volume filters cannot be used, which significantly increases costs.

What is desired is an improved SDR transmitter and receiver design that obviates the need for custom made signal filters.

SUMMARY

Techniques for circumventing the necessity for custom made signal filters for the receiving path of a radio system are described. In an example, a method of operating a transceiver of radio system is disclosed. The method includes receiving, using a receiver-path of the radio system, an RF input signal from an antenna, converting the RF input signal to fall within a pre-defined frequency range using a local oscillation signal obtained from a transmitter-path of the radio system, and processing the converted input signal with a standard filter.

In some examples, the standard filter is an "off the shelf" filter.

In some examples, converting the RF input signal includes generating the local oscillation signal in the transmitter path, and mixing the RF input signal with the local oscillation signal.

In another example, an RF front-end for a radio system is disclosed. The RF front-end includes an antenna, a transmitter path and a receiver path, each coupled to the antenna. The transmitter path includes a parallel path directly coupled to the receiver path configured to provide a local oscillator signal, and the receiver path includes a mixer. The mixer is configured to receive the local oscillator signal from the parallel path and an input signal from the antenna, convert the input signal to fall within a pre-defined frequency range, and provide the converted input signal to a standard filter.

In some examples, the standard filter is one of a ceramic or a surface acoustic wave (SAW) filter. In some examples, the mixer is further configured to convert the input signal to a center frequency of the pre-defined range.

These and other aspects may be understood with reference to the following detailed description.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements of one example may be beneficially incorporated in other examples.

DETAILED DESCRIPTION

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described.

As noted above, SDR systems generally require steep antenna RF-filters in order to comply with international radio specifications to suppress out-of-band emissions during transmission (TX), and reject outside interferers during reception (RX). Such filter components are, depending on the application, custom designed, expensive and low volume parts that are specialized for a given use-case.

In order to mitigate this supply chain inconvenience, in one or more examples, the antenna filter specification for an SDR front-end may be relaxed. As a result, in one or more examples, the RX and TX filter requirements may be made independent of part availability. In one or more examples, the antenna RF filter specification may be derived solely from the TX filter requirements, and any additionally required filters in the RX signal path may be easily selected due to bandwidth, availability and filter order requirements. Thus, in one or more embodiments, an actual center frequency of the filter becomes a lower priority, as opposed to the conventional case, where center frequency is an extremely limiting factor during part selection.

In one or more examples, in order to fit the signal to a center frequency of an available off-the-shelf filter, an RX-input signal may be mixed into a required frequency band. In such examples, a local clock for the mixer can conveniently be derived from the otherwise idle TX-path during reception, and, in some examples, be adaptable to actual in-band channel usage. Thus, in various embodiments according to the present disclosure, the necessity for complex custom made filters for the RX path of a radio system (RX) is obviated by converting a signal of interest to a frequency range where off-the-shelf parts are available. Time division duplex (TDD) systems, which have an idle TX-path during reception, may particularly benefit from various embodiments which use the TX-path during reception to supply a generated local oscillation signal to the mixer of the RX-path.

Figure 1:
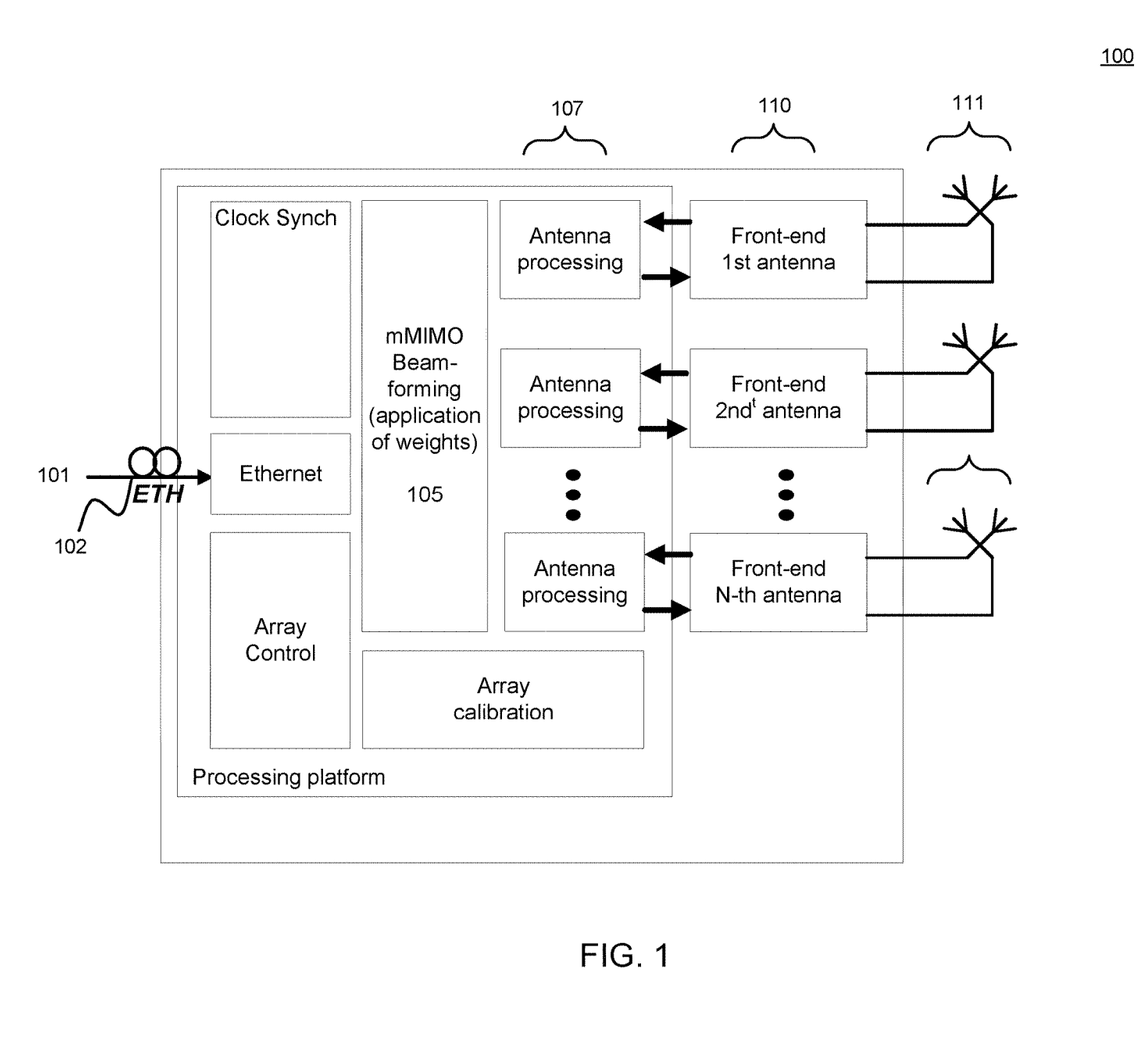
FIG. 1 is a block diagram depicting an example massive multiple input multiple output ("MMIMO") radio unit, according to an example.

FIG. 1 is a block diagram depicting an example MMIMO radio unit 100, according to an example. The radio unit is known as "MMIMO" because it has a large array of antennas and supports beamforming, with better throughput and better spectrum efficiency. With reference thereto, beginning at the far left of the figure, the radio unit 100 receives an incoming signal 101 from a baseband unit (not shown), over, for example, an ethernet connection 102, as shown. The radio unit 100 includes MMIMO beam forming circuitry 105, which provides signals to each of several antenna processing circuits 107. Each of the antenna processing circuits 107 is connected to a respective one of N front-end circuits 110. A front-end circuit includes both a transmission path and a reception path, and these respective paths are described in greater detail below with reference to FIGS. 3 and 4. In some examples, the number of front-end circuits and corresponding antennas N may be 32, 64, or more. Similarly, each of the N front-end circuits 110 is coupled to its own antenna of N antennas 111, as shown. The N antennas 111 are known collectively as an array of antennas. Each of the N antennas 111 may be separately controlled. As shown by the two arrows connecting each of the antenna processing circuits 107 to its respective front-end circuit 110, each front-end circuit may be used for both transmission and reception. It is here noted, as described in detail below, in some examples, when the front-end circuit is used for receiving, the transmitter-path is idle. In one or more examples, the idle transmitter-path may be leveraged to generate a local oscillation signal which may then be utilized in the receiver-path.

It is noted that in alternate examples, techniques according to the present disclosure may also be applied to frequency division duplex (FDD) systems. In such alternate examples, the desired signal and the local oscillator (LO) are transmitted at the same time, and the LO signal and transmit signal should be separated by a diplexer. Thus, the LO signal may be provided to the mixer and the transmit signal may be provided to the antenna.

Figure 2:
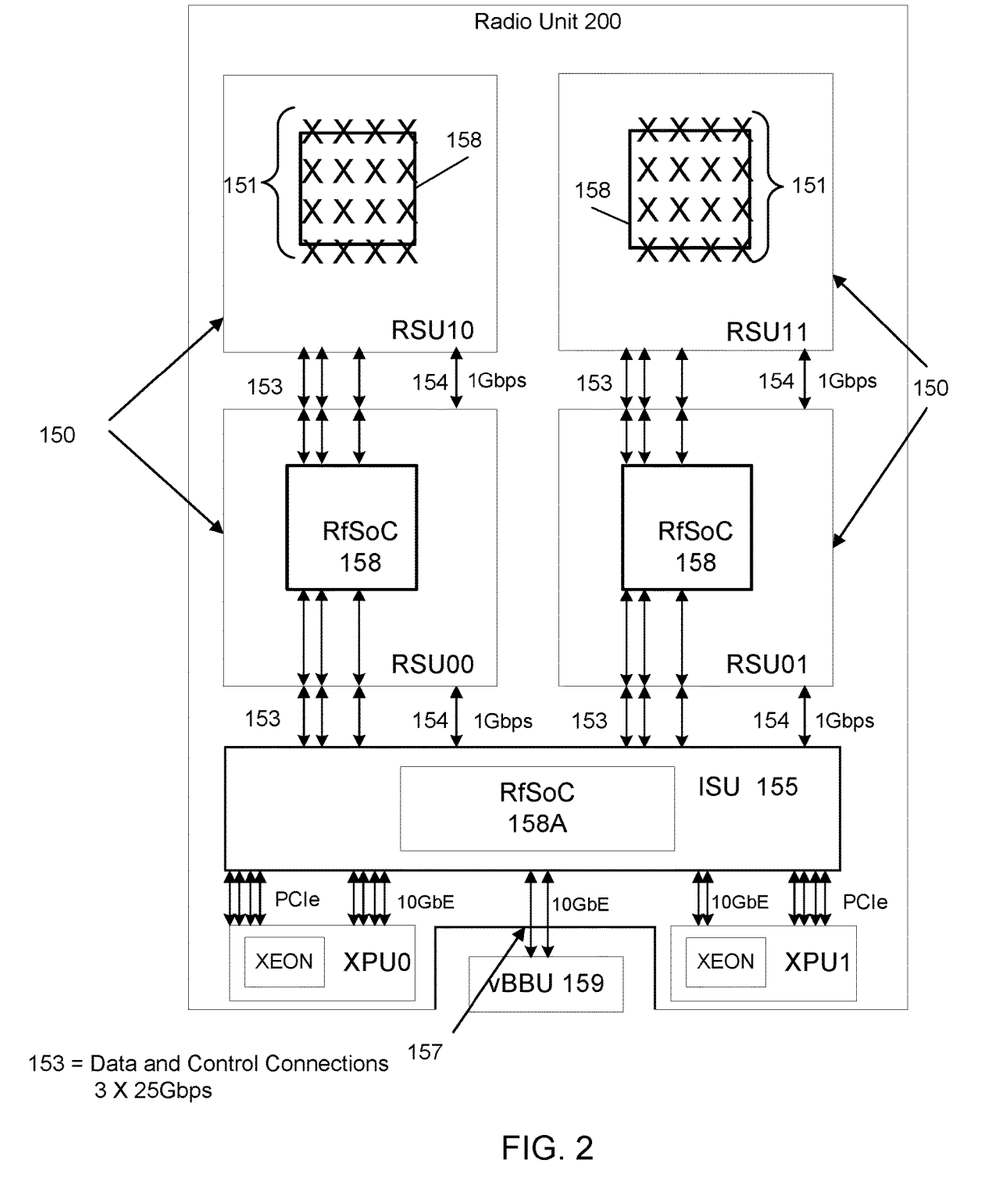
FIG. 2 depicts an example radio unit architecture, according to an example.

FIG. 2 illustrates an example radio unit architecture 200, according to an example. Thus, FIG. 2 shows how the various functionalities are of the radio unit 200 are divided between radio sub-units 150 ("RSUs"). Each RSU hosts front end, antenna processing, array calibration and control, and clock circuitry. With reference thereto, beginning at the bottom of the figure, there is an interface to a baseband unit ("BBU") 157. In the example of FIG. 2, interface 157 is a 10 gigabit Ethernet (10 GbE) connection, as shown, between interface sub-unit ("ISU") 155 and a virtual baseband unit ("vBBU") 159. Via interface 157, data is either provided to the radio unit 200 during transmission, from the BBU, or, during reception, data is received off of the air via antenna arrays 151, and is provided from the RSUs 150 to the BBU. It is noted that in some examples, transmission and reception for each of the 64 RFEs on the radio unit 200 are time division multiplexed ("TDM"), so that the radio unit 200 is only performing one of these at any given time.

Continuing with reference to FIG. 2, in one or more examples, the ISU 155 is responsible for providing interfaces to the vBBU, the processing units ("XPUs") and the RSUs. It is noted that vBBUs are not located in a base station. Rather, they may be provided in a data center in the cloud. It is further noted that while the resources of a "traditional" BBU are limited, because a vBBU is located in the cloud, one may request more resources, if needed from others. This approach is much more flexible from an architecture point of view, and it is understood by the inventors hereof that implementations using vBBUs will be the next step in 5G communications systems. In alternate examples, however, a more traditional BBU may be used.

Continuing with reference to FIG. 2, ISU 155, as shown, includes a radio frequency system on chip ("RfSoC") 158A, RfSoC 158A processes incoming Ethernet (ETH) data streams, handles distribution of data towards the XPUs and a local PS, handles synchronization of clocks, beamforming, UL processing, inter-RSU-communications, provides interface communication with the other radio units, and manages software updates. The ISU 155 is connected, via data and control connections 153, which in this example include three parallel 25 Gbps links, as shown, to each of four radio sub units ("RSUs") 150. In the example architecture of FIG. 2 these are named, for easy reference, RSU00, RSU01, RSU10 and RSU11, as shown. Moreover, each of the RSUs includes its own RfSoC 158, which may be a high-speed analog to digital converter/digital to analog converter ("ADC/DAC") in some examples, the RfSoCs may be Zynq UltraScale+RFSoCs, as provided by Xilinx, Inc., of San Jose, Calif. In one or more examples, each of the four RfSoCs 158 respectively provides signals to an array of N antennas, which are indicated by an array of "X"s that are shown in the two RSUs at the top of the figure. For ease of viewing, the illustrated "X"s indicating individual antennas are only shown for RSU10 and RSU11, but they are understood to be there for each of RSU00 and RSU01, as well. In the example architecture of FIG. 2, each RSU has a 4×4 array 151 of antennas, and thus each RfSoC 158 of each RSU 150 controls 16 antennas. In alternate examples, the antenna array 151 in an RSU 150 may be larger, such as an array of 4×8, 8×4, or 8×8 antennas, for example. In each antenna array 151, between each antenna and its respective RfSoC 158 are provided two signal pathways, one for TX and another for RX. Collectively, these two pathways are known as an "RF front-end" that interfaces with an antenna. Details of the RF front-ends are next described, first as to a conventional RF front-end with reference to FIGS. 3A and 3B, and then as to an improved RF front-end according to one or more examples, with reference to FIG. 4.

Figure 3A:
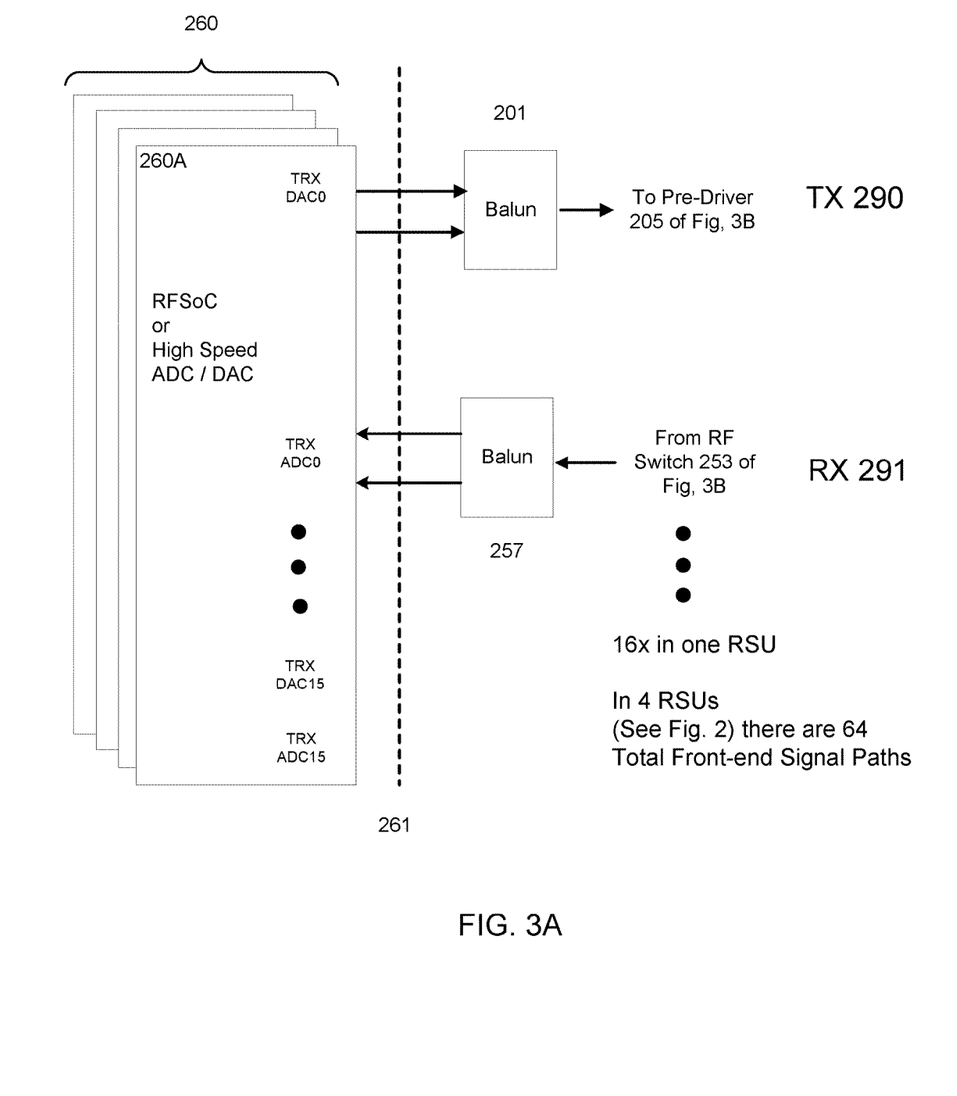
FIG. 3A illustrates an example RF system on chip (RFSoC) used in an example radio sub unit, according to an example.
Figure 3B:
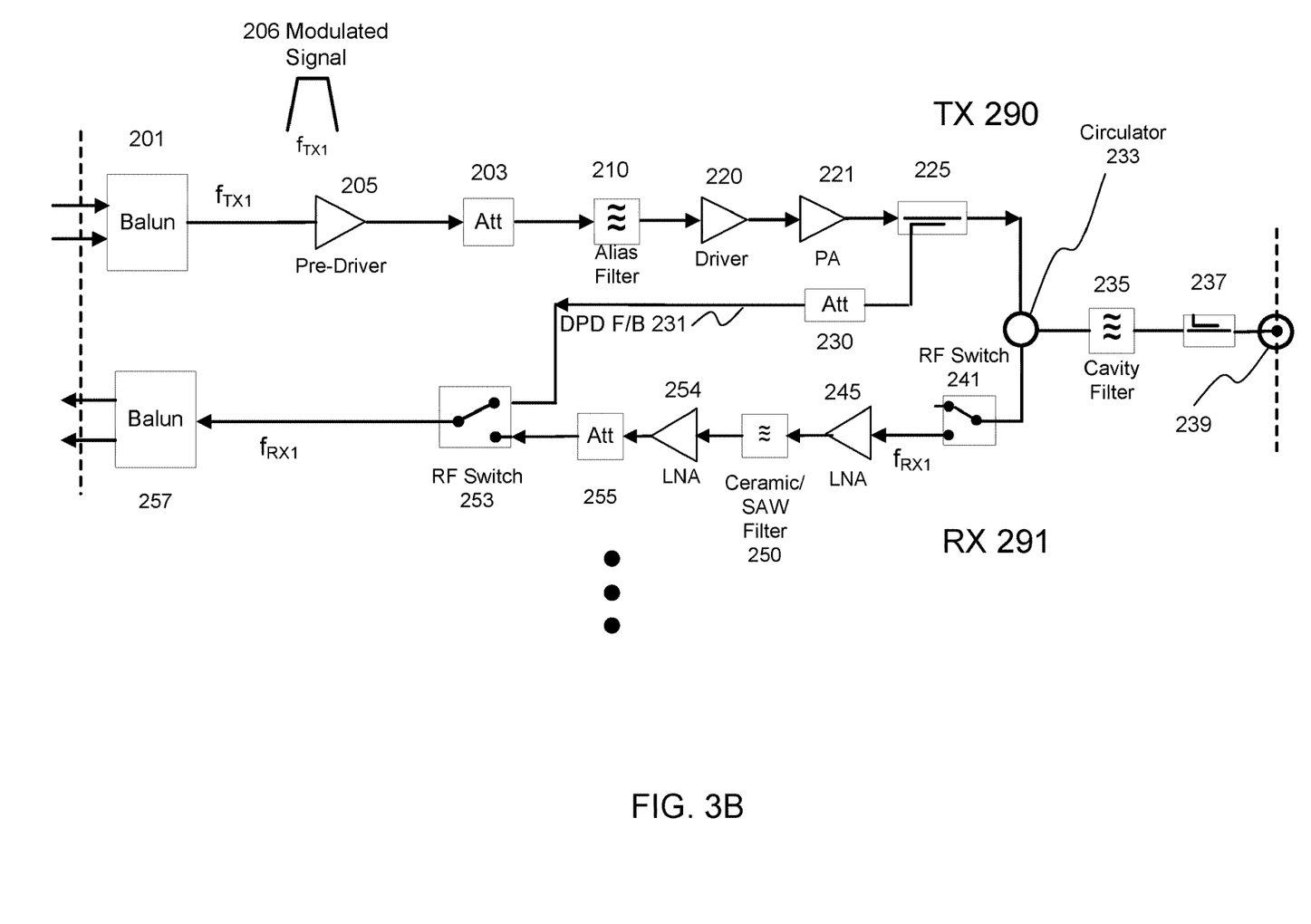
FIG. 3B illustrates a single conventional RF transmit and receive path that is connected to the example RFSoC of FIG. 3A.

FIGS. 3A and 3B together illustrate a conventional RF front-end ("FE"), where FIG. 3A illustrates an example RFSoC and its connections to a first side of the RF FE, and FIG. 3B illustrates a second side of the RF FE, connected to an antenna. Both FIGS. 3A and 3B show balancer-unbalancers (which is known as a "balun") 201 on the TX path, and balun 257 on the RX path, for ease of mentally connecting and integrating the two figures. These baluns 201, 257 are where FIG. 3A ends at the right of the figure, and also where FIG. 3B begins, at the left of the figure, as respectively shown. Thus, baluns 201 and 257 serve as points of overlap between FIGS. 3A and 3B.

With reference to FIG. 3A, there are shown two signal paths, one on the top, a transmission path, labeled TX 290, and the other on the bottom, being a reception path, labeled RX 291. There are also shown a set of four RFSoCs 260, stacked one upon the other. A first RFSOC of the set 260, RFSoC 260A, on the top of the stack, is shown in detail. The four RFSoCs 260 of FIG. 3 respectively correspond to the four RfSoCs 158 respectively provided in each of the four RSUs 150 of FIG. 2. As shown in FIG. 3A, RFSoC 260A, which is representative of all four RFSoCs 260, has sixteen DAC/ADC pairs. These begin at the top of RFSoC 260A with TRX DAC0 and TRX ADC0, and continue down to TRX DAC15 and TRX ADC15, as shown. Each DAC/ADC pair is respectively connected to its own TX 290 and RX 291 paths, which themselves are both connected to a single antenna of the antenna array of one RSU. Thus, for example, TRX DAC0, shown at the top right of RFSoC 260A, which converts a digital signal ultimately provided by a BBU to an analog signal for RF transmission, is connected to the beginning of the TX pathway 290 of a first of the 16 front-ends controlled by the RFSoC 260A, namely, to balun 201. Similarly, TRX ADC0, shown in FIG. 3A somewhat below TRX DAC0, which converts a received RF input signal off of the air to a digital signal for baseband processing, is connected to the end of the RX pathway 291 of the first of the 16 front-ends ("FEs") controlled by RFSoC 260A, namely, to balun 257. Although only the first FE is shown, there are 15 additional FEs, each connected RFSoC 260A on one end, and to its own antenna on the other end. Thus, in the example of FIGS. 3A and 3B, over the set of four RFSoCs 260, there are a total of 64 FEs.

Continuing with reference to FIG. 3A, on the TX path 290, the output of balun 201 is provided to pre-driver 205 of FIG. 3B, and on the RX path 291, the input to balun 257 comes from RF switch 253 of FIG. 3B. As noted in FIG. 3A, in this example, there are fifteen additional essentially identical FEs also provided on RFSoC 260A (not shown), and similarly, sixteen essentially identical FEs on each of the other three RFSoCs in the set of RFSoCs 260, for a total of 64 FE signal paths.

FIG. 3B illustrates the remaining portion of each of the TX 290 and RX 291 pathways of the first FE of RFSoC 260A whose initial (leftmost) portions are illustrated in FIG. 3A. With reference to FIG. 3B, The TX path 290 includes elements 201 through 225, the RX path 291 includes elements 241 through 257, and elements 233, 235 and 237 together comprise a common path that connects to the antenna 239. Additionally, there is digital pre-distortion ("DPD") calibration feedback path 231 that connects directional coupler 225 on the TX path to switch 253 on the RX path, via attenuator 230 to adjust to receiver input level. Directional coupler 225 splits the TX signal to each of the antenna 239 and the DPD feedback path, as described more fully below.

Continuing with reference to FIG. 3B, the TX pathway 290 begins with balun 201. A balun is a device that joins a balanced line (e.g., one that has two conductors, with equal currents in opposite directions, such as a twisted pair cable) to an unbalanced line (e.g., one that has just one conductor and a ground, such as a coaxial cable). Thus, a balun is a type of transformer, and it is used to convert an unbalanced signal to a balanced one, or vice versa. As shown, balun 201 provides a modulated signal 206 at a frequency of $f_{TX1}$, to pre-driver 205. From pre-driver 205 the modulated signal 206 is provided, in sequence, to attenuator 203, alias filter 210, driver 220, power amplifier 221, and directional coupler 225. Directional coupler 225, as noted, provides the TX signal to each of antenna 239 and the DPD feedback. From directional coupler 225 the modulated signal 206 continues on the TX path to circulator 233, which is used to regulate the signal flow A circulator guides the signal flow ideally in just one direction, e.g. from TX to the antenna 239 in the TX operating case, and from antenna 239 to the RX in receive operating case. Thus, there is no transmission in the other direction possible. For example, the received signal cannot go from the antenna back to the TX path, and a transmitted signal cannot go back on the RX path 291. From circulator 233, the modulated signal 206 goes through cavity filter 235 and directional coupler 237, and out through antenna 239. In the depicted TDD example, when the RSU 260A is transmitting, it is not receiving any input signal from the air. Thus, as shown in FIG. 3B, RF switch 253 connects the DPD feedback path 231 to balun 257, and RF switch 241 is open. In particular, it is terminated from RF point of view, but the connection to main RX is open, as shown, so that there is no signal path through ceramic filter 250. This is done because when the system is transmitting, the third circulator's port has to be terminated to maintain isolation between paths.

Continuing with reference to FIG. 3B, as regards RX path 291, when the RSU 260A is receiving, then RF switch 241 is in a receiver position, and RF switch 253 connects balun 257 to attenuator 255. This allows an input signal received at antenna 239, and filtered at cavity filter 235, to pass through RF switch 241 at a frequency of $f_{RX1}$, as shown. The signal proceeds through low noise amplifier 245, ceramic filter 250, another low-noise amplifier 254 (used because of required noise performance), and attenuator 255, and on through RF switch 253 to balun 257 and into the RFSoC 260A (as shown in FIG. 3A). During reception, the DPD feedback path 231 is thus isolated, and no signal passes through it. It is noted that the other output of switch 241 is connected to a 50 ohm termination (not depicted). It is an RF protection switch, used in case the antenna is defective and thus there is a high power reflected signal in the RX path 291, which may destroy the LNA 245. Thus, in order to avoid this, RF switch 241 is implemented.

It is noted that in one or more examples, all of the example components in FIG. 3B are off the shelf, e.g., commonly available, hardware components. Thus, as noted above, in the TX path 290, 205, 220, 221 are amplifiers, as are elements 244 and 245 in in RX path 291. These are used to amplify the desired signal. Components 203, 230 and 255 are adjustable attenuators, used to compensate spread of the components as regards gain or loss. Elements 225 and 237 are couplers used for internal calibration reasons, and 233 is a circulator is used in TDD systems. Thus, another option includes using a TX/RX high power switch on this position. As noted, 241 is a switch to protect the RX path 291 during transmission, and switch 253 is used for a selection of the RX path during reception, or to receive the calibration path 231 during transmission. The calibration path 231 is not used during reception.

As alluded to above, there is a serious problem inherent in the design of the conventional RF FE shown in FIGS. 3A and 3B. As noted, current SDR systems require steep antenna RF-filters in order to comply with international radio specifications mandating the suppression of out-of-band emissions during TX, and the rejection of outside interference during RX. Distributed filter design is a common praxis and is often required. However, while ceramic or SAW filters are relatively inexpensive, they do not exist for many of the frequency bands needed, such as, for example, 5G NR bands sub-6 GHz. Thus, it is hard to source filters for ceramic filter 250 in the RX path of FIG. 3B. On the other hand, cavity filters exist, such as may be used for cavity filter 235 in FIG. 3B, but they are expensive, large, and heavy, being made out of metal.

Thus, in order to meet the mandated noise filtering requirements, when a ceramic filter 250 does not exist, the filter order of the cavity filter has to be increased, or "beefed up." This leads to tougher requirements for the cavity filter, in terms of higher cost, and increased weight and size. It is noted in this context that in order to fulfil the requirements in the 3rd Generation Partnership Project (3GPP) standard, a suppression or rejection of unwanted signals at a 10 MHz offset from the edges of the band is needed, by, for example, 24 dB. With reference to FIG. 3B, for this requirement one may try to design one filter 235 with the 24 dB suppression at this point, or, alternatively, one may attempt to split it into two filters with 12 dB rejection at the 10 MHz of each. As an example of the first option, the filter with the 24 dB rejection requires, for example, a filter order of 8 (which is large, and thus more expensive). As an example of the second option, one may attempt to achieve the same suppression with two filters with lesser order (e.g., 4+4 or 3+5, etc.), in which latter case the filter 235 may be smaller and thus less expensive. Filters such as ceramic/SAW filter 250, for the lower frequency bands (e.g., those less than 3 GHz) are available as off the shelf components, and are economical. But the required filters 250 for frequencies higher than 3 GHz do not exist. And if no such filters exist, then the cavity filter 235 must cover all of the noise attenuation requirements.

However, if a distributed design in the same frequency range is not possible, such as because there is no filter 250 that is available, then a conversion in a lower frequency range (where filters 250 do exist) would help. Thus, in one or more examples, this problem can be remedied by adding a frequency conversion path to the front end of FIG. 3B, such as is shown in FIG. 4, next described.

Accordingly, in one or more examples, instead of sourcing filters for the needed higher frequencies above 3 GHz, an additional signal may be generated to mix with a received high frequency signal, thereby lowering it to a frequency for which SAW filters commonly do exist. This may be done, for example, for each addressed band above 3 GHz, inasmuch as a down conversion or mixing in of a "conventional" band with an existing filter (low cost) is less expensive than the alternative of using expensive filtering in the higher frequency range. Currently, the edge for such filters is in the 3 GHz range and the disclosed techniques may thus be used for each band in 3GPP having operating frequencies higher than 3 GHz.

Figure 4:
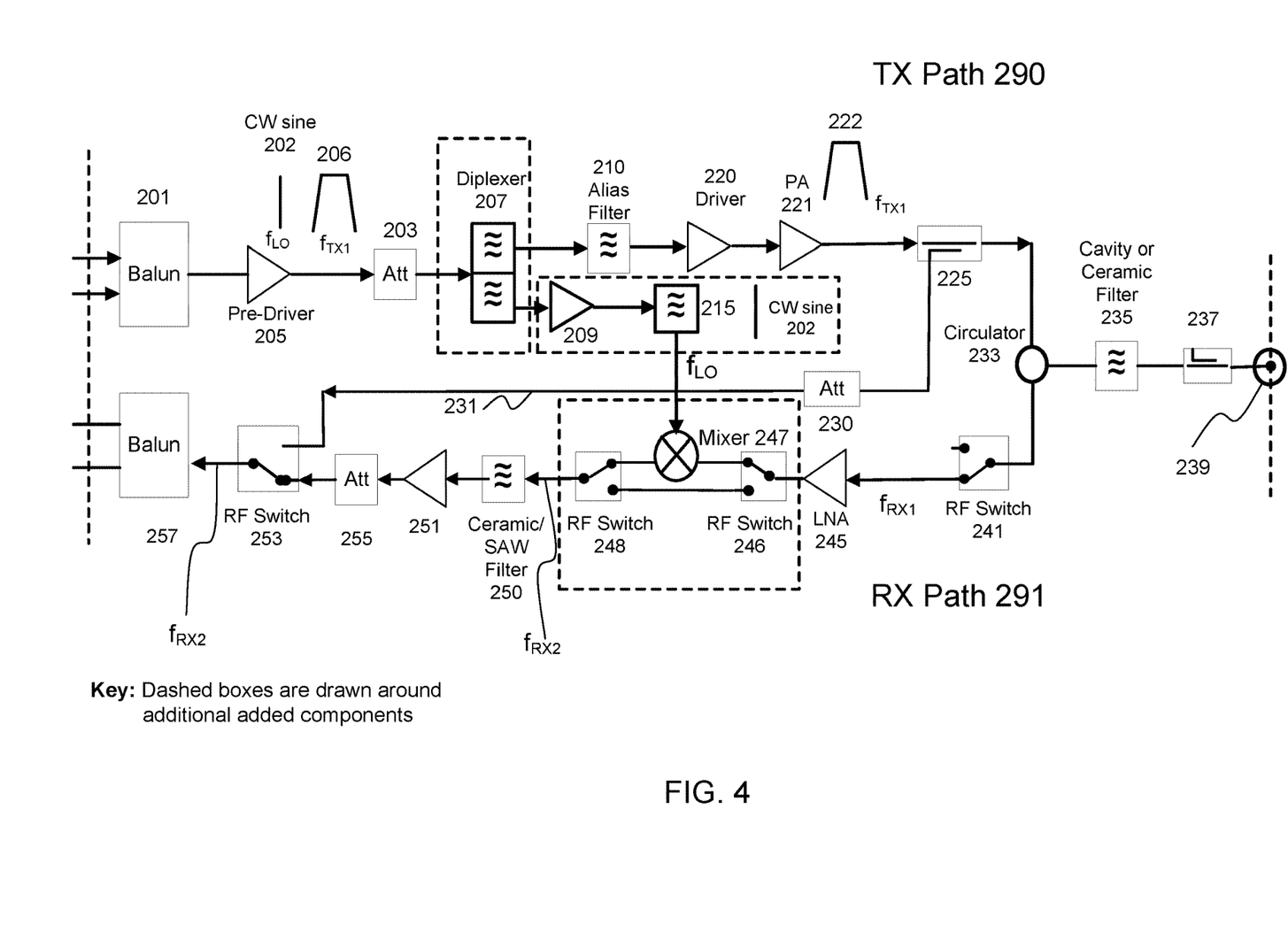
FIG. 4 is an alternate RF transceiver architecture according to an example.

FIG. 4 illustrates an RF front-end according to an example. The radio system of which the example front-end illustrated in FIG. 4 is a part of is a TDD system, and thus, during an RX period, there is no TX signal being processed. The example front-end of FIG. 4 implements an SDR filter requirement relaxation technique, which, in one or more examples, facilitates changing the order of the antenna front-end cavity filter 235. In one or more examples, this changing of cavity filter order leads directly to reduction of cost, reduction of size and reduction of weight for the cavity filter 235. Because, as described above, various examples include antenna array systems, these changes affect, for example, 32, 64, or even more signal paths, which becomes significant. In one or more examples, the front-end of FIG. 4 would use the same RFSoC 260A as is illustrated in FIG. 3A, or an equivalent.

As next described in detail, in one or more examples the necessity for complex custom filters for the RX path of a radio system is circumvented by converting an input signal of interest to a frequency range where off-the-shelf parts are available. As noted, in some examples, these techniques target TDD systems where the otherwise idle TX-path may be used during RX to supply a generated local oscillation signal to a mixer added to the RX-path.

Thus, in one or more examples, RX-path filter 250 may be implemented as a ceramic/SAW filter in a frequency range where such filters commonly exist, e.g., a lower frequency range than $f_{RX1}$, that of an RF input signal of interest. In order to use such a filter, an additional frequency conversion is performed in the RX-path, to a frequency that falls within a range of frequencies that the commonly available ceramic filter can handle. In one or more examples this allows for relaxation of the requirements for the expensive and heavy cavity filter 235. So as not to defeat the purpose of this technique, in one or more examples the additional frequency conversion may be performed using off the shelf components as well, such as, for example, a mixer, a diplexer, one or more drivers. Details of the additional frequency conversion are next described with reference to FIG. 4.

The front-end illustrated in FIG. 4 is similar to that shown in FIGS. 3A and 3B, with some key differences. Those components already described with reference to FIG. 3B need not be described again with reference to FIG. 4, and thus, in what follows, only the differences between the two figures are described.

With reference to FIG. 4, there is an additional frequency conversion path relative to the example conventional front-end shown in FIG. 3B. The added elements are shown within dashed boxes, for ease of identification. Thus, the additional frequency conversion path includes diplexer 207, amplifier 209, bandpass filter 215, and mixer 247. In addition, so as to be able to either switch the RX path through mixer 247 or bypass it, new RF switches 246 and 248 are also added. These additional elements are next described in detail.

It is first noted, as shown at the output of pre-driver 205, that the TX path now provides two separate signals. These include modulated signal 206, and a new continuous wave ("CW") sine signal 202. The CW sine signal 202 is only provided when the TX path is idle, and this CW sine signal 202, having frequency $f_{LO}$, is used as a local oscillator input to mixer 247. As may be noted by comparing FIG. 4 with FIG. 3B, in the TX path, diplexer 207 has been inserted between attenuator 203 and alias filter 210. As its symbol illustrates, a diplexer is a type of RF splitter that divides an input signal into two output paths, here one that goes through alias filter 210, and the other one that ultimately feeds into mixer 247. From diplexer 207, during an RX period of the FE, CW sine 202 is sequentially provided to amplifier 209 and filter 215. Diplexer 207 sends one frequency band to one port and the other frequency band to the other port, thus acting as a filter rejecting the other frequency signal.

As shown, the output of filter 215 is CW sine 202 having a frequency of $f_{LO}$. This signal is then input to mixer 247, as shown. The other input to mixer 247 is the RF input signal received at antenna 239.

Continuing with reference to FIG. 4, in the RX path, between LNA 245 and ceramic/SAW filter 250 there have been inserted RF switches 246 and 248, with mixer 247 between them. Thus, during an RX period of the example front-end, when the RX-path is thus active, and thus RF switches 241 and 253 couple the antenna 239 to the RX path, as shown (bypassing the bypass path 231), RF switches 246 and 248 may route the RX signal path through mixer 247. These RF switches 246 and 248 allow the same front-end to be used for both received RF input signals that are compatible with ceramic/SAW filter 250, and thus the RF switches may bypass mixer 247, and for those RF input signals that are not compatible, in which case the RX signal path runs through mixer 247. In general, a ceramic/SAW filter is best suited to applications up to 3 GHz, but, it is noted, filter selectivity starts to decline above 1.5 GHz.

By mixing, at mixer 247, the RF input signal at $f_{RX1}$, say, for example, having a frequency of 3500 MHz, with the local oscillator fro, having, for example, an example frequency of 2400 MHz, the output of RF switch 248, at frequency $f_{RX2}$, now falls within the frequency range of commonly available ceramic/SAW filter 250. In some embodiments, the frequency $f_{RX2}$ is the center frequency of ceramic/SAW filter 250. As shown, $f_{RX2}$ is ultimately provided to balun 257, and on to the RFSoC.

In some examples, as shown in the example of FIG. 4, the LO signal CW 202 for the mixer 247 may be generated externally via a phase locked loop (PLL) and an external feeding and distribution network. In other embodiments, it may be generated internally at DAC0 of RFSoC 260A shown in FIG. 3A, for example.

Thus, in one or more examples, due to the added frequency conversion, an off the shelf component may be used for ceramic/SAW filter 250, and thus the requirements for antenna filter 235 may be relaxed.

In one or more examples, the local oscillator is adaptable to in-band channel usage. In a communication system there is generally defined an "RF bandwidth" as well as an instantaneous bandwidth ("BW"). However, only the instantaneous BW is used for transmission, and it is within the RF bandwidth. Thus, for example, a given system may be addressing 3GPP Band 42 (3.4 GHz-3.6 GHz) with a 200 MHz overall bandwidth, but actually transmitting just a signal with a bandwidth (BW) by 40 MHz. This 40 MHz block can be transmit e.g. from 3.40 GHz to 3.44 GHz or 3.55 GHz to 3.59 MHz. Depending upon the addressed block or frequency one would here use a 200 MHz filter for filter 235, but could use a smaller one for filter 250, of only 40 MHz. Because the BW and frequency of filter 235 is fixed, the local oscillator frequency may be adjusted based upon the incoming $f_{RX1}$ frequency. Thus, if $f_{RX2}$ is given, for example as {2350+/−20 MHz} and the incoming received signal $f_{RX1}$ is {3420 MHz+/−20 MHz} then the $f_{LO}$ frequency should adjust to 1070 MHz. Or, for example, if $f_{RX1}$ is {3570 MHz+/−20 MHz} then the $f_{LO}$ is set to 1220 MHz.

Figure 5:
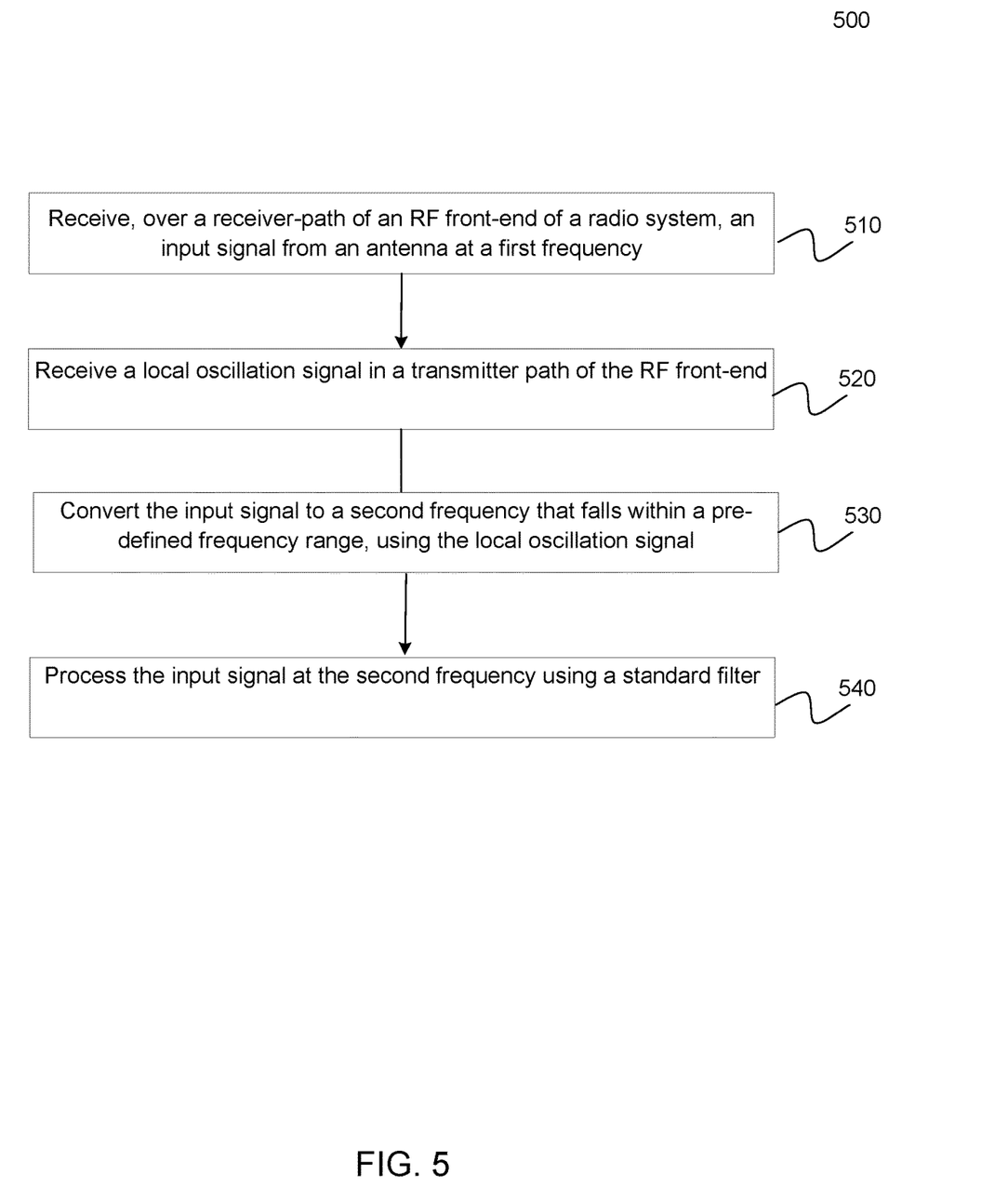
FIG. 5 is a flow diagram depicting a method of receiving an RF signal according to an example.

FIG. 5 is a flow diagram depicting a method 500 of receiving an RF signal according to an example. The method includes blocks 510 through 540. In alternate examples of the method, there may be greater, or fewer, blocks. The method 500 begins at step 510, where an input signal from an antenna is received, at a first frequency, over a receiver-path of an RF front-end of a radio system. For example, the RF input signal may be a signal received at antenna 239 in FIG. 4, and it may have frequency $f_{RX1}$.

From block 510, method 500 proceeds to block 520, where a LO signal is received in a TX-path of the RF front end. For example, the LO signal may be CW sine 202 of FIG. 4, and it may be generated by DAC0 of FIG. 3A, which is coupled to the transmitter path 290.

From block 520 method 500 proceeds to block 530, where the RF input signal is converted to a second frequency, that falls within a pre-defined frequency range, using the local oscillation signal. For example, this may be performed by mixer 247 of FIG. 4, which mixes the RF input signal at $f_{RX1}$ with the local oscillator CW sine 202 at $f_{LO}$ to output a signal frequency $f_{RX2}$, which now falls within the frequency range of ceramic/SAW filter 250. For example, given the pre-defined frequency range, $f_{LO}$ may be adjusted as a function of the first frequency so as to insure that the second frequency falls within the desired range. Thus, as one example, if $f_{RX2}$ is to fall within, for example, the frequency range {2350+/−20 MHz}, and the first frequency $f_{RX1}$ is {3420 MHz+/−20 MHz} then the $f_{LO}$ frequency may be adjusted to 1070 MHz. Or, for example, for the same pre-defined frequency range of {2350+/−20 MHz}, if $f_{RX1}$ is {3570 MHz+/−20 MHz} then the $f_{LO}$ may be adjusted to be 1220 MHz.

From block 530 method 500 proceeds to block 540, where the converted input signal at the second frequency is processed with a standard filter. For example, as shown in FIG. 4, a converted input signal at frequency $f_{RX2}$ is processed by ceramic/SAW filter 250, and then passed on through the RX-path to balun 257, and from there to a connected RFSoC.

While the foregoing is directed to specific examples, other and further examples may be devised without departing from the basic scope thereof, and the scope thereof is determined by the claims that follow.

What is claimed is:

1. A method of operating a radio system, comprising:
receiving, over a receiver-path of a radio frequency (RF) front-end of the radio system, an RF input signal from an antenna;
converting, in a first mode, the RF input signal to fall within a pre-defined frequency range by mixing the RF input signal with a local oscillation signal;
processing, in the first mode, the converted input signal with a standard filter; and
processing, in a second mode, the RF input signal with the standard filter.

2. The method of claim 1, wherein converting the RF input signal includes mixing the RF input signal with the local oscillation signal.

3. The method of claim 1, further comprising generating the local oscillation signal in a digital to analog converter (DAC) coupled to the RF front-end of the radio system.

4. The method of claim 3, wherein the local oscillation signal is adaptable to in-band channel usage.

5. The method of claim 1, wherein the local oscillation signal is generated by a phase locked loop external to the RF front-end.

6. The method of claim 1, wherein the standard filter is one available as an off the shelf part.

7. The method of claim 6, wherein the standard filter is one of a ceramic or a surface acoustic wave (SAW) filter.

8. The method of claim 1, wherein the pre-defined frequency range is less than 3 GHz.

9. The method of claim 1, wherein the RF input signal is converted to a center frequency of the pre-defined frequency range.

10. The method of claim 1, further comprising generating the local oscillation signal from a sine wave at a local oscillation frequency (fro) received from a transmitter path of the RF front-end.

11. The method of claim 10, wherein the RF input signal is mixed with the sine wave in a first path of a receiver path of the RF front-end, and the RF input signal is processed with the standard filter in a second path of the receiver path of the RF front-end, wherein the first path is parallel to the second path.

12. A radio frequency (RF) front-end for a radio system, comprising:
an antenna;
a transmitter path and a receiver path, each coupled to the antenna;

the transmitter path including a parallel path directly coupled to the receiver path configured to provide a local oscillator signal;

the receiver path including a mixer, wherein in a first mode the mixer is connected to a standard filter and the mixer is configured to:

receive the local oscillator signal from the parallel path and an input signal from the antenna;

convert the input signal to fall within a pre-defined frequency range; and provide the converted input signal to the standard filter, and wherein in a second mode, the mixer is disconnected from the standard filter and the input signal bypasses the mixer.

13. The RF front-end of claim 12, wherein the standard filter is one of a ceramic or a surface acoustic wave (SAW) filter.

14. The RF front-end of claim 12, wherein the mixer is further configured to convert the input signal to a center frequency of the pre-defined frequency range.

15. The RF front-end of claim 12, wherein the mixer is provided in a first path of the receiver path of the RF front-end that is parallel to a second path of the receiver path of the RF front-end.

16. The RF front-end of claim 12, wherein the standard filter is one available as an off the shelf part.

17. The RF front-end of claim 12, wherein the local oscillation signal is generated by a digital to analog converter (DAC).

18. The RF front-end of claim 17, wherein the DAC is provided in a radio frequency system on chip (RFSoC) of a radio unit, the RFSoC coupled to the transmitter path.

19. The RF front-end of claim 12, further comprising a diplexer in the transmitter path, configured to split the transmitter path into two parallel paths, one of which is directly coupled to the receiver path.

20. The RF front-end of claim 12, wherein at least one of:
the local oscillation signal is adaptable to in-band channel usage, or
a frequency of the local oscillation signal is adjusted based upon a frequency of a received input signal.

* * * * *

UNITED STATES PATENT AND TRADEMARK OFFICE
CERTIFICATE OF CORRECTION

PATENT NO. : 11,251,822 B1
APPLICATION NO. : 16/937527
DATED : February 15, 2022
INVENTOR(S) : Gundel et al.

Page 1 of 1

It is certified that error appears in the above-identified patent and that said Letters Patent is hereby corrected as shown below:

In the Specification

Column 9, Line 7, Delete "fro" and insert -- $f_{LO}$ --, therefor.

In the Claims

Column 10, Line 55, In Claim 10, delete "(fro)" and insert -- ($f_{LO}$) --, therefor.

Signed and Sealed this
Twenty-first Day of June, 2022

Katherine Kelly Vidal
*Director of the United States Patent and Trademark Office*